United States Patent
Kim (10) Patent No.: US 8,149,543 B2
(45) Date of Patent: Apr. 3, 2012

(54) HARD DISK DRIVE APPARATUS HAVING A FLEXIBLE PRINTED CIRCUIT WITH A PLURALITY OF TRACES IN A SPECIFIED ORDER

(75) Inventor: Jong Yoon Kim, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 1038 days.

(21) Appl. No.: 12/033,177

(22) Filed: Feb. 19, 2008

(65) Prior Publication Data

US 2008/0204931 A1    Aug. 28, 2008

(30) Foreign Application Priority Data

Feb. 23, 2007    (KR) .................. 10-2007-0018458

(51) Int. Cl.
*G11B 5/55* (2006.01)
(52) U.S. Cl. .................. 360/264.2; 360/245.9; 360/246
(58) Field of Classification Search ............... 360/264.2, 360/245.8–246, 266.3
See application file for complete search history.

(56) References Cited

U.S. PATENT DOCUMENTS 6,665,149 B2 * 12/2003 Abe ........................ 360/264.2
6,678,121 B2 *  1/2004 Lee et al. .................. 360/265

FOREIGN PATENT DOCUMENTS

| JP | 2002-123917 | 4/2002 |
|---|---|---|
| JP | 2003-272119 | 9/2003 |
| JP | 2004-55126 | 2/2004 |
| KR | 2003-0037570 | 5/2003 |
| KR | 2003-37570 | 5/2003 |

OTHER PUBLICATIONS

Korean Office Action mailed Feb. 26, 2008 in KR 10-2007-0018458.

* cited by examiner

*Primary Examiner* — Allen Heinz
(74) *Attorney, Agent, or Firm* — Stanzione & Kim, LLP (57) ABSTRACT

A hard disk drive apparatus includes a magnetic head having a write head to record data on a disk and a read head to read the data recorded on the disk, at least one actuator arm on which the magnetic head is mounted, a voice coil motor to rotate the at least one actuator arm across the disk, a printed circuit board electrically connected to the write head, the read head, and the voice coil motor, and a flexible printed circuit having at least one write trace to electrically connect the write head and the printed circuit board, at least one read trace to electrically connect the read head and the printed circuit board, and a voice coil motor trace to electrically connect the voice coil motor and the printed circuit board. In the hard disk drive, the write trace is arranged between the read trace and the voice coil motor trace.

28 Claims, 8 Drawing Sheets

(PRIOR ART)

FIG. 1

(PRIOR ART)

HARD DISK DRIVE APPARATUS HAVING A FLEXIBLE PRINTED CIRCUIT WITH A PLURALITY OF TRACES IN A SPECIFIED ORDER

CROSS-REFERENCE TO RELATED APPLICATIONS

This application claims the priority of Korean Patent Application No. 10-2007-0018458, filed on 23 Feb. 2007, in the Korean Intellectual Property Office, the disclosure of which is incorporated herein in its entirety by reference.

BACKGROUND OF THE INVENTION

1. Field of the Invention

The present general inventive concept relates to a hard disk drive apparatus, and more particularly, to a hard disk drive which can minimize a change in a magnetoresistance value of a read head due to electrostatic discharge.

2. Description of the Related Art

Hard disk drives (HDDs) include electronic parts and mechanical parts, as memory devices to record and reproduce data by converting digital electric pulses to a magnetic field that is more permanent. The HDDs are widely used as auxiliary memory devices of computer systems because of fast access time to a large amount of data.

Figure 1:
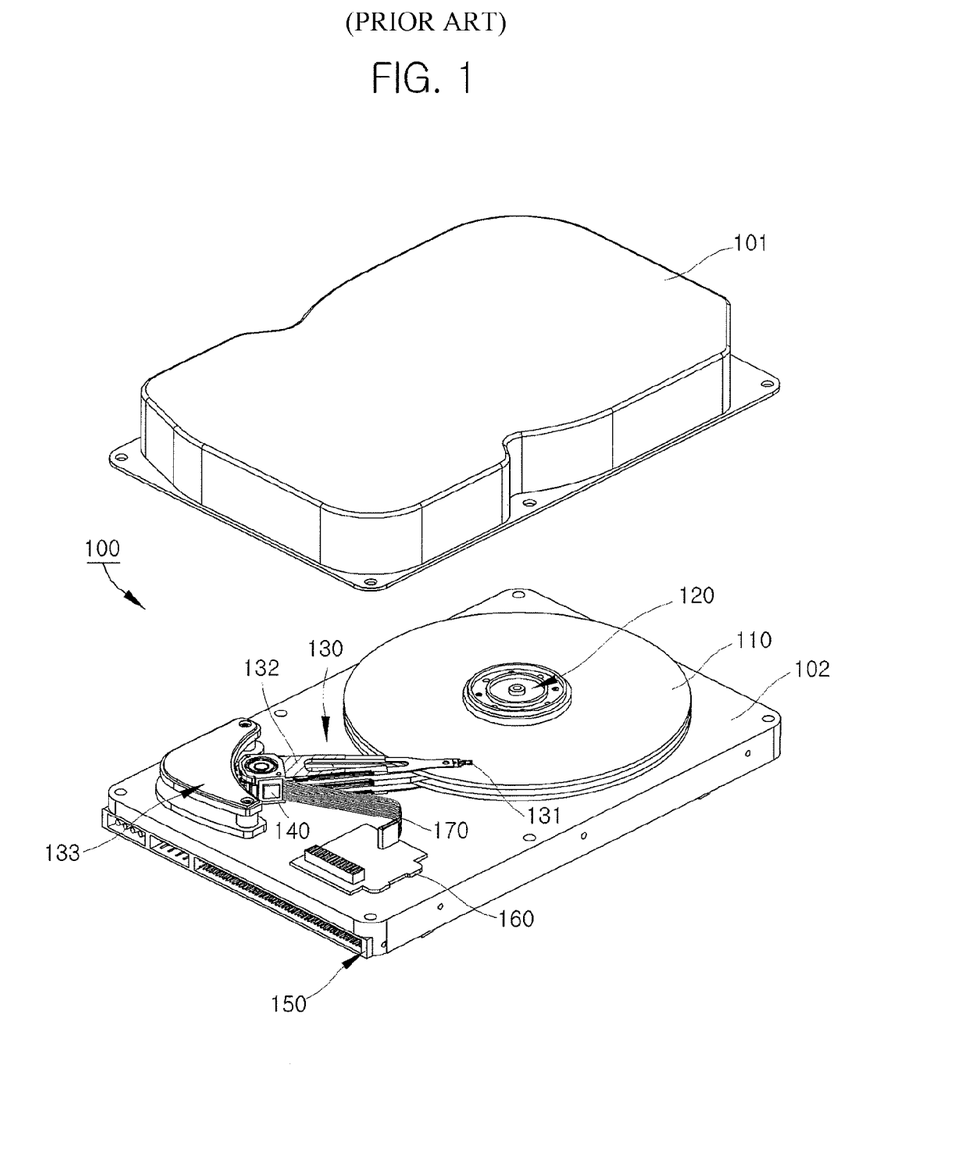
FIG. 1 is a partially exploded perspective view illustrating a conventional hard disk drive.

A hard disk drive 100 as illustrated in FIG. 1 includes a disk 110 recording data, a spindle motor 120 rotating the disk 110, and a head stack assembly 130. An actuator arm 132 is provided at a side of the head stack assembly 130. A magnetic head 131 is mounted on the actuator arm 132 to record or reproduce data with respect to the disk 110. A voice coil motor (VCM) 133 rotating the actuator arm 132 is provided at the opposite side of the head stack assembly 130.

The hard disk drive 100 also includes various circuits related to the operational control of the magnetic head 131, the voice coil motor 133, and the spindle motor 120. These circuits are mostly provided on a printed circuit board (not shown) on a printed circuit board assembly 140 which is provided in a lower portion of a base 102 of the hard disk drive 100. A pre-amplifier (Pre-AMP) amplifying a signal read from the magnetic head 131 or a write current input to the magnetic head 131 is provided at a side of the head stack assembly 130 as one of the circuits in the printed circuit board assembly 140, and other circuits are provided on a portion other than the side of the head stack assembly 130.

Figure 2:
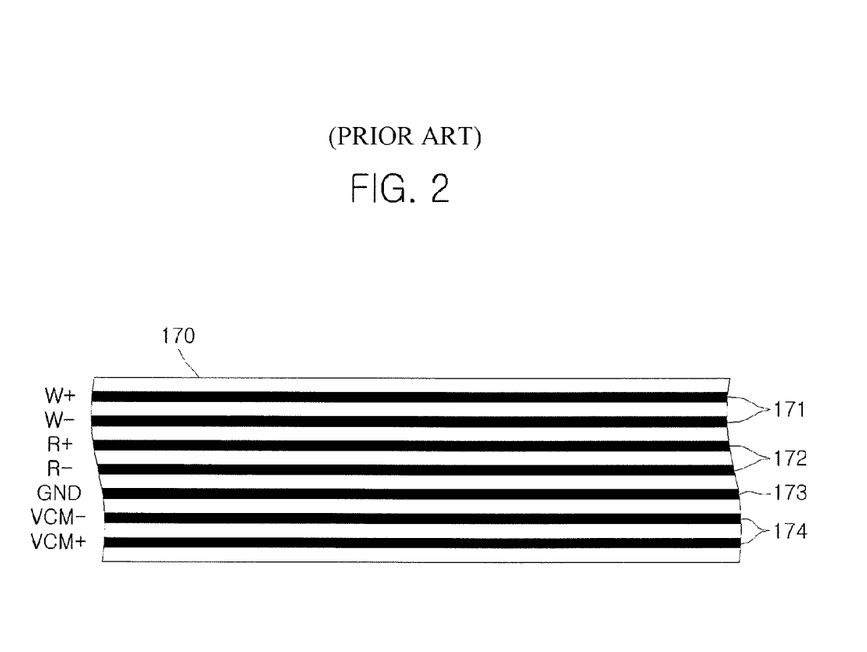
FIG. 2 illustrates an example of a trace layout of an FPC of the hard disk drive of FIG. 1.

A bracket 160 is provided on an upper surface of the base 102 to be connected to the printed circuit board. The bracket 160 and the pre-amplifier 140 are connected by a flexible printed circuit (FPC) 170. A plurality of metal wirings, that is, traces, are arranged on the FPC 170 as illustrated in FIG. 2. That is, The plurality of metal wirings are arranged to include a write trace 171 related to the write operation of the magnetic head 131, a read trace 172 related to the read operation of the magnetic head 131, a ground trace (GND trace) 173 performing a ground function, and a voice coil motor trace (VCM trace) 174 related to the operation of the voice coil motor 133. A connector or interface 150 is provided on the base 102 to connect the FPC 170 and an external device, such as a computer apparatus, through the bracket 160.

Recently, a compact hard disk drive is increasingly applied to electronic devices such as mobile phones or car navigator. Hard disk drives having a diameter of 2.5 inches or less are often referred to as the compact hard disk drive.

The miniaturization of the hard disk drive causes various technical difficulties. One of the technical difficulties is the deterioration of an electrostatic discharge (ESD) characteristic due to the decrease in a gap between the traces arranged on the FPC 170. The ESD can be easily found in everyday life and the ESD can be generated in parts such as the head stack assembly 130 or the FPC 170 of the hard disk drive, if it is not intended. It is widely known that, when a conductive body contacts an object having static electricity, the static electricity moves along a passage of the conductive body.

However, as illustrated in FIG. 1, when a hand of a user or an object capable of acting as a conductive body contacts the head stack assembly 130 or the FPC 170 before the hard disk drive is completely assembled, that is, before a cover 101 is capped, the static electricity remaining in the part has a flow. At this time, current flow instantly in the traces 171-174 of the FCB 170. Then, a magnetic field is formed around the traces 171-174 to electrically affect adjacent other trances 171-174.

In particular, it is important to consider the electric effect of the ground trace 173 or the voice coil motor trace 174 to the read trace 172. When current flows in the ground trace 173 or the voice coil trace 174 by the ESD due to the contact of a conductive body, an induced electromotive force is generated in the read trace 172 adjacent to a magnetic field formed by the traces 173 and 174. The induced electromotive force is proportional to the instant change rate of a magnetic field. Since the ESD is made very instantly, the induced electromotive force generated in the read trace 172 appears as a relatively high value. Thus, when the read head of the magnetic head 131 electrically connected to the read trace 172 is a magnetoresistive (MR) head, an excess current flows in the read head by the induced electromotive force generated in the read trace 172, so that a resistance value of the read head can deviate from an allowance. When the resistance value of the read head deviates from the allowance, the reading of the data by the read head cannot be normally made.

The generation of the excess current in the read trace 172 is more dominant in a compact hard disk drive in which the width of the FPC 170 is narrow. When the width of the FPC 170 decreases, the read trace 172 needs to be arranged closer to the ground trace 173 or the voice coil motor trace 174.

An ESD circuit which cuts off the flow of the excess current due to the ESD from the read trace 172 to the read head is provided in the pre-amplifier 140 which is connected to the FPC 170 at the side of the head stack assembly 130. However, since the size of the head stack assembly 130 needs to be decreased in the compact hard disk drive, the pre-amplifier 140 is difficult to be installed at the head stack assembly 130. That is, the pre-amplifier 140 needs to be installed at the position of the bracket 160 located on the upper surface of the base 102. The ESD circuit included in the pre-amplifier 140 cannot prevent the excess current due to the ESD transferred from the read trace 172 to the read head.

SUMMARY OF THE INVENTION

The present general inventive concept provides a hard disk drive apparatus which can minimize a change in a magnetoresistance value of a read head occurring due to an electrostatic discharge generated in a flexible circuit board during a manufacturing process.

Additional aspects and utilities of the present general inventive concept will be set forth in part in the description which follows and, in part, will be obvious from the description, or may be learned by practice of the general inventive concept.

The foregoing and/or other aspects of the present general inventive concept may be achieved by providing a hard disk drive including a magnetic head having a write head to record data on a disk and a read head to read the data from the disk, at least one actuator arm on which the magnetic head is mounted, a voice coil motor to rotate the at least one actuator arm across the disk, a printed circuit board electrically connected to the write head, the read head, and the voice coil motor, and a flexible printed circuit having at least one write trace to electrically connect the write head and the printed circuit board, at least one read trace to electrically connect the read head and the printed circuit board, and a voice coil motor trace to electrically connect the voice coil motor and the printed circuit board, wherein the at least one write trace is arranged between the read trace and the voice coil motor trace.

A ground trace may be further arranged on the flexible printed circuit to ground the flexible printed circuit, and the at least one write trace may be arranged between the read trace and the ground trace.

The voice coil motor trace and the ground trace may be arranged close to each other.

When each of the write trace and the read trace is provided in a number corresponding to a multiple of 2, the write trace and the read trace may be arranged in the same number in the opposite directions with respect to an axis in a lengthwise direction of the flexible printed circuit, and the write trace and the read trace may be arranged symmetrical to the axis in the lengthwise direction of the flexible printed circuit.

The hard disk drive may be further include a pre-amplifier which is provided between the printed circuit board and the flexible printed circuit and amplifies a write current supplied to the write head or a read signal read by the read head.

The pre-amplifier may be installed at a side surface of a bracket which electrically connects upper and lower portions of the base of the hard disk drive.

The read head may be a magnetoresistive head.

The radius of the disk may not be greater than 2.5 inches.

The foregoing and/or other aspects and utilities of the present general inventive concept may also be achieved by providing a hard disk drive including a magnetic head having a write head to record data on a disk and a read head to read the data from the disk, at least one actuator arm on which the magnetic head is mounted, a voice coil motor to rotate the at least one actuator arm across the disk, a printed circuit board electrically connected to the write head, the read head, and the voice coil motor, and a flexible printed circuit having at least one write trace to electrically connect the write head and the printed circuit board, at least one read trace to electrically connect the read head and the printed circuit board, and a ground trace to ground the flexible printed circuit, wherein the at least one write trace is arranged between the read trace and the ground trace.

When each of the write trace and the read trace is provided in a number corresponding to a multiple of 2, the write trace and the read trace may be arranged in the same number in the opposite directions with respect to an axis in a lengthwise direction of the flexible printed circuit, and the write trace and the read trace may be arranged symmetrical to the axis in the lengthwise direction of the flexible printed circuit.

The hard disk drive may further include a pre-amplifier which is provided between the printed circuit board and the flexible printed circuit and amplifies a write current supplied to the write head or a read signal read by the read head.

The pre-amplifier may be installed at a side surface of a bracket which electrically connects upper and lower portions of the base of the hard disk drive.

The read head may be a magnetoresistive head.

The radius of the disk may not be greater than 2.5 inches.

The foregoing and/or other aspects and utilities of the present general inventive concept may also be achieved by providing a hard disk drive apparatus a magnetic head including a write head to record data on a disk and a read head to read the data recorded on the disk, at least one actuator arm on which the magnetic head is mounted, a voice coil motor rotating the at least one actuator arm across the disk, a printed circuit board electrically connected to the write head, the read head, and the voice coil motor, and a flexible printed circuit having at least one write trace to electrically connect the write head and the printed circuit board, at least one read trace to electrically connect the read head and the printed circuit board, a ground trace to ground the flexible printed circuit, and a voice coil motor trace to electrically connect the voice coil motor and the printed circuit board, wherein the at least one write trace is arranged between the read trace and one of the voice coil motor trace and the ground trace.

The foregoing and/or other aspects and utilities of the present general inventive concept may also be achieved by providing a hard disk drive apparatus a magnetic head including a write head to record data on a disk and a read head to read the data recorded on the disk, at least one actuator arm on which the magnetic head is mounted, a voice coil motor rotating the at least one actuator arm across the disk, a printed circuit board electrically connected to the write head, the read head, and the voice coil motor, and a flexible printed circuit having at least one write trace to electrically connect the write head and the printed circuit board, at least one read trace to electrically connect the read head and the printed circuit board, and at least one of a ground trace to ground the flexible printed circuit and a voice coil motor trace to electrically connect the voice coil motor and the printed circuit board and disposed such that the at least one write trace is arranged between the read trace and the one of the voice coil motor trace and the ground trace.

The at least one write trace, the at least one read trace, the ground trace, and the voice coil motor trace may be arranged in order.

The at least one read trace may be spaced-apart from the one of the voice coil motor trace and the ground trace by a first distance, and the least one write trace may be spaced-apart from the one of the voice coil motor trace and the ground trace by a second distance shorter than the first distance.

The printed circuit board may include a pre-amplifier, and the flexible printed circuit may be disposed between the pre-amplifier and at least one of the magnetic head and the voice coil motor.

The hard disk drive apparatus may further include a base, a bracket formed on the base, and a pre-amplify disposed on the bracket and connected to the flexible printed circuit to amply data.

The hard disk drive apparatus may further include a base, a bracket formed on the base; and a pre-amplify disposed on the bracket, and the flexible printed circuit may include a first end connected to the magnetic head and the voice coil motor and a second end connected to the pre-amplifier.

The at least one write trace may include first and second write traces, the at least one read trace may include first and second write traces, and the first write trace may be disposed between the first and second read traces.

The at least one write trace may include first and second write traces, the at least one read trace may include first and second write traces, and the second read trace may be disposed between the first and second write traces.

The at least one write trace may include first and second write traces, the at least one read trace may include first and second write traces, at least one of the first and second write traces is spaced-apart from the one of the voice coil motor trace and the ground trace by a first distance, at least one of the first and second read traces may be spaced-apart from the one of the voice coil motor trace and the ground trace by a second distance, and the first distance may be longer than the second distance.

The foregoing and/or other aspects and utilities of the present general inventive concept may also be achieved by providing a hard disk drive apparatus including a magnetic head including a write head to record data on a disk and a read head to read the data recorded on the disk, at least one actuator arm on which the magnetic head is mounted, a voice coil motor rotating the at least one actuator arm across the disk, a printed circuit board having a pre-amplifier to amplify data, and a flexible printed circuit to electrically connect the magnetic head and the voice coil motor to the pre-amplifier.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
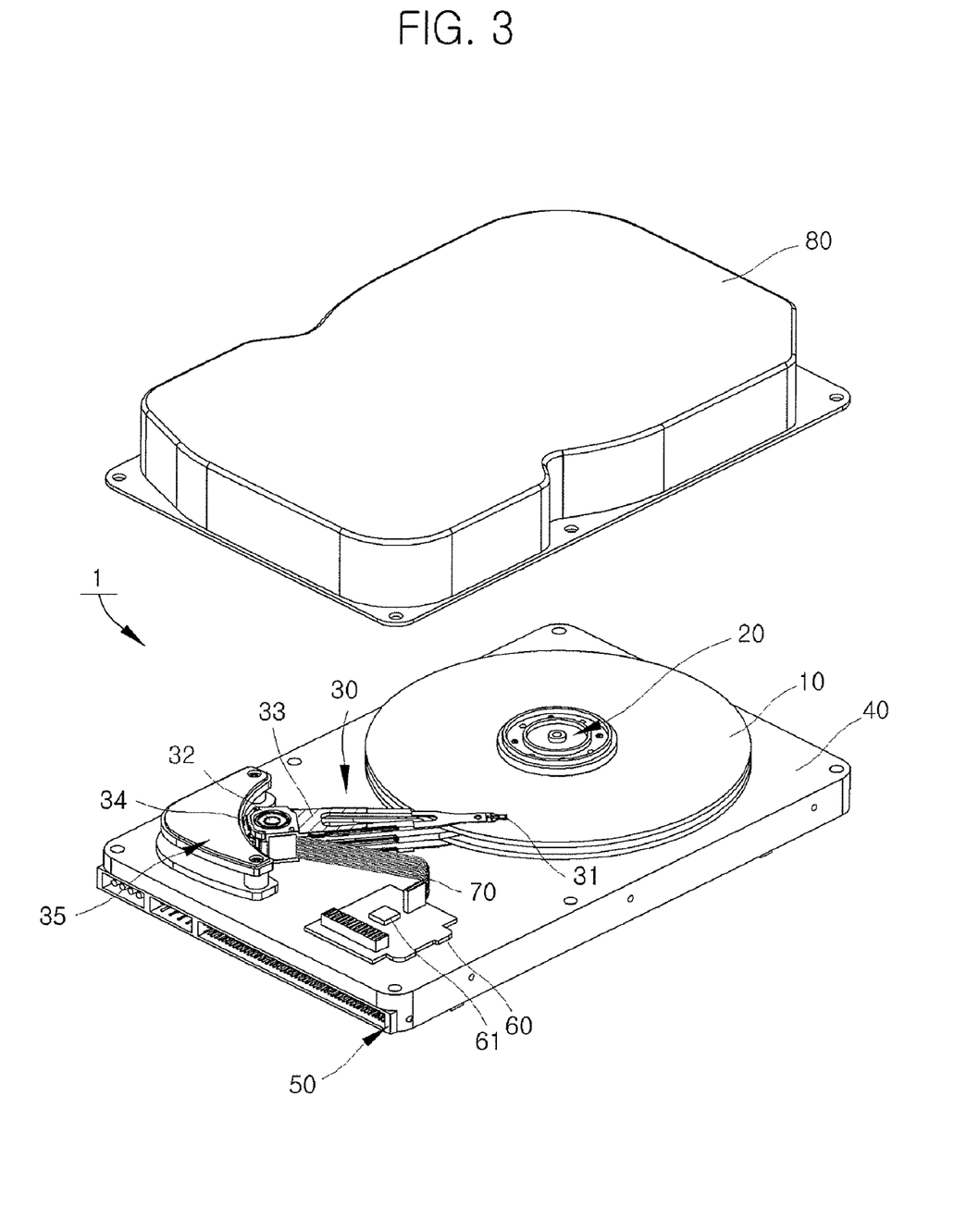
FIG. 3 is a partially exploded perspective view illustrating a hard disk drive apparatus according to an embodiment of the present general inventive concept.
Figure 4:
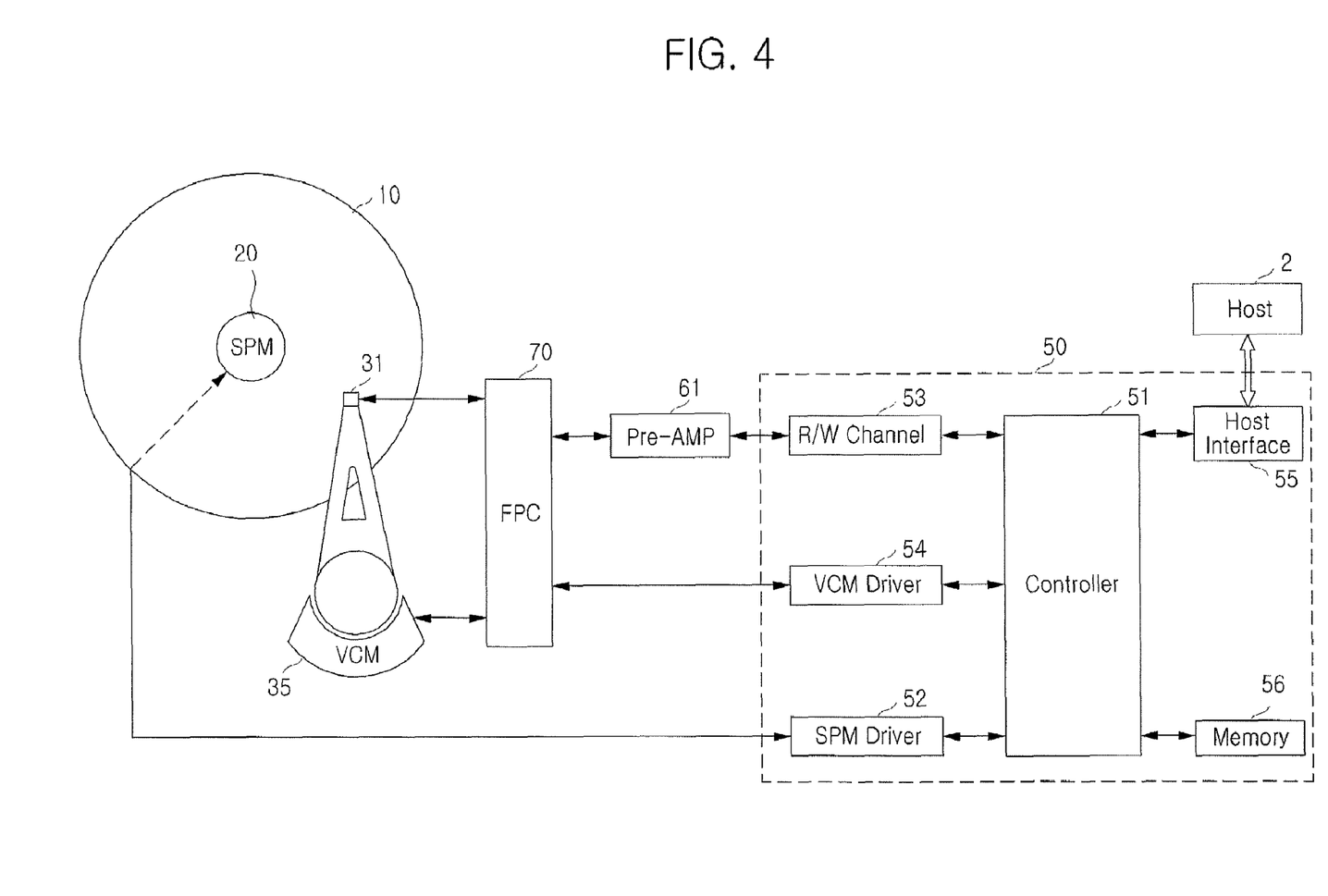
FIG. 4 is a block diagram illustrating a drive circuit of the hard disk drive of FIG. 3.
Figure 5:
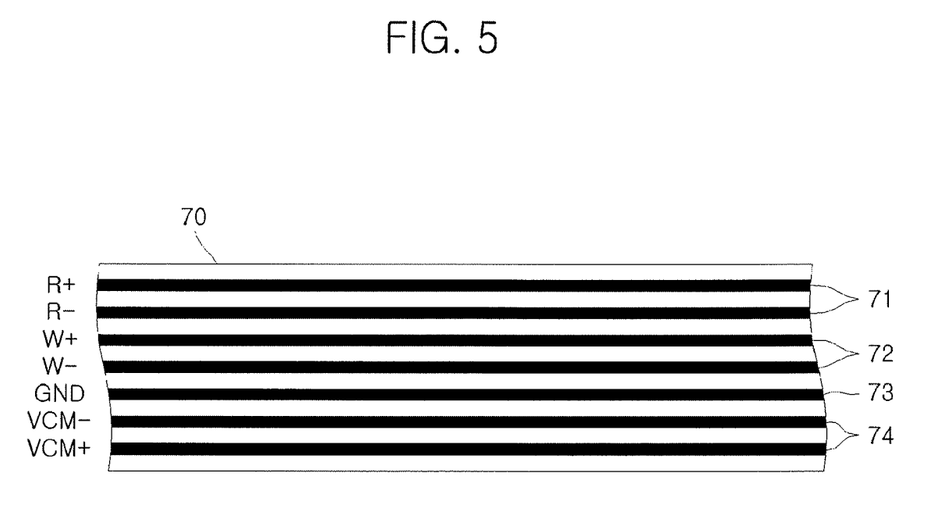
FIG. 5 illustrates an example of a trace layout of an FPC of FIG. 3.
Figure 6:
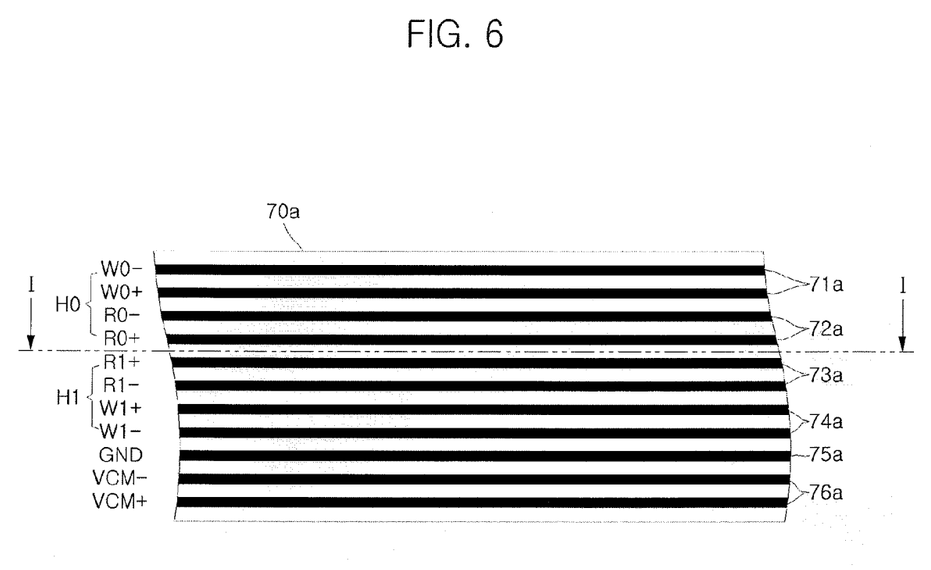
FIG. 6 illustrates an example of a trace layout of an FPC of FIG. 3.
Figure 7:
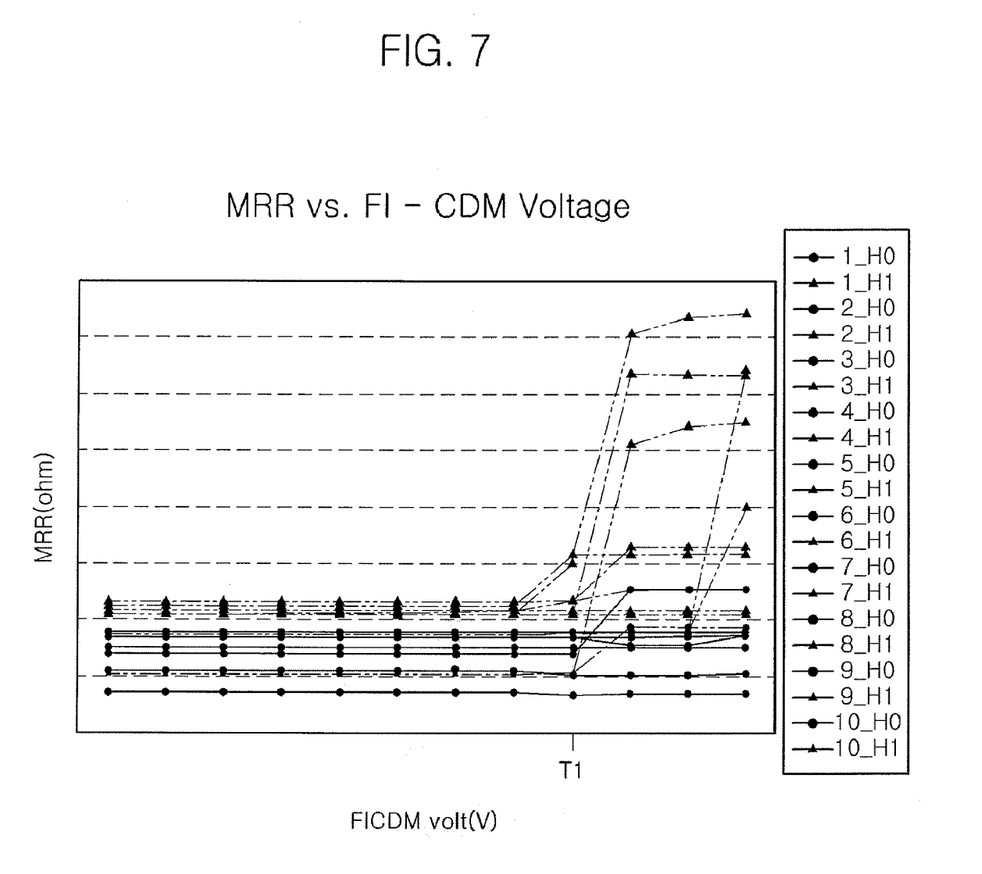
FIGS. 7 and 8 are graphs illustrating results of a test of an electrostatic characteristic of the hard disk drive of FIG. 3 using an FI-CDM.
Figure 8:
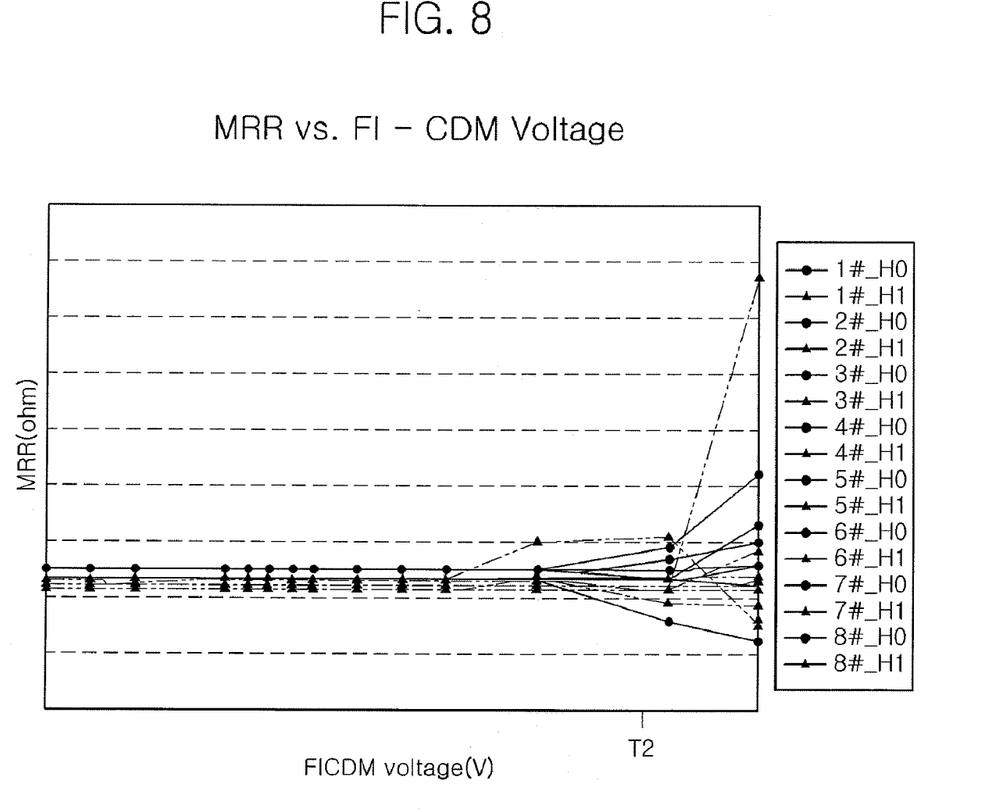

FIG. 3 is a partially exploded perspective view illustrating a hard disk drive apparatus according to an embodiment of the present general inventive concept. FIG. 4 is a block diagram illustrating a drive circuit of the hard disk drive of FIG. 3. FIG. 5 illustrates an example of a trace layout of an FPC of the hard disk drive of FIG. 3. FIG. 6 illustrates another example of the trace layout of the FPC of the hard disk drive of FIG. 1. FIGS. 7 and 8 are graphs illustrating a result of a test of an electrostatic characteristic of the hard disk drive of FIG. 3 using an FI-CDM. The embodiments of the present general inventive concept will be described in detail with reference to FIGS. 3 to 8.

Referring to FIG. 3, the hard disk drive 1 according to an embodiment of the present general inventive concept includes a disk 10 to store data, a spindle motor 20 to support and rotate the disk 10, a head stack assembly (HSA) 30 to record and reproduce data with respect to the disk 10, a base 40 on which constituent parts are assembled and supported, a printed circuit board assembly (PCBA) 50 coupled to a lower or upper portion of the base 40 to controller an operation of various parts of the hard disk drive 1, a bracket 60 to electrically connect the upper and lower portions of the base 40, a flexible printed circuit (FPC) 70 to electrically connect the bracket 60 and the HSA 30, and a cover 80 covering the upper portion of the base 40. A connector or interface 50 may be formed on the base to be connected to an external computer and the FPC 70 through the bracket 60 to transmit and receive data therebetween.

The disk 10 is a media to record and store data and may include a plurality of disks. The disk 10 is divided into a plurality of tracks that are concentric with a center of the disk 10. Each track is divided into a plurality of sectors. In general, a size of the hard disk drive 1 is classified according to a radius of the disk 10. The radius of the disk 10 in FIG. 3 is 2.5 inches. Thus, the hard disk drive 1 in the present embodiment belongs to a range of a compact hard disk drive. A rotational angular speed of the spindle motor 20 may be 3,600 rpm, 5,400 rpm, 7,200 rpm, or 10,000 rpm.

The HSA 30 is a carriage to record or reproduce data with respect to the disk 10. The HSA 30 includes a magnetic head 31 to record data on the disk 10 or reproduce the recorded data, an actuator arm 33 to pivot around a pivot shaft 32 to control the magnet head 31 to cross the disk 10, so that the magnetic head 31 can access the data on the disk 10, a pivot shaft holder 34 to support the pivot shaft 32 capable of rotating, to which the actuator arm 33 is coupled and supported, and a voice coil motor (VCM) 35 provided at an opposite side of the actuator arm 33 with respect to the pivot shaft 32 to rotate the actuator arm 33.

The magnetic head 31 includes a write head to write data and a read head to read data. The write head writes the data by magnetizing a surface of the disk 10 while the read head reads the data by detecting a magnetic field formed on the surface of the disk 10. The read head is a magnetoresistive (MR) head, in detail, a giant magnetoresistive (GMR) head that is one of MR heads. The MR head is a resistive body in which an amount of a resistance value varies according to the detected magnetic field. The hard disk drive 1 can read the data by reading the resistance value of the magnetoresistive head.

The actuator arm 33 has one end connected to the magnetic head 31 and the other end rotatably coupled to the pivot shaft 32. The actuator arm 33 is extended long so that the magnetic head 31 can move over the surface of the disk 10. In the present embodiment, the actuator arm 33 can be provided in the HSA 30 in plural. The pivot shaft holder 34 rotatably supports the pivot shaft 32 and simultaneously supports the actuator arm 33 coupled to the pivot shaft holder 34.

The VCM 35 makes the actuator arm 33 rotate around the pivot shaft 32. The VCM 35 includes a voice coil (not illustrated) and a magnet (not illustrated). The VCM 35 makes the actuator arm 33 pivot by an electromagnetic force generated by the interaction between lines of a magnetic force generated by the magnet and a current flowing in the voice coil.

Although in the present embodiment the VCM 35 is provided to rotate the actuator arm 33, a stepper motor capable of rotating the actuator arm 33 by a predetermined angle according to an input signal can be used instead. However, the VCM 35 has advantages in that it has a high heat-insulating characteristic, a periodic format is not needed, and reliability is superior.

A printed circuit board assembly (PCBA) 50 is coupled to a lower portion of the base 40, on which a printed circuit board (PCB, not illustrated) is installed. Various circuits to control the operations of parts, such as the HSA 30 and the spindle motor 20, are provided on the PCB, which will be described later referring to FIG. 4. The PCB of the PCBA 50 may be connected to the FPC 70 through the bracket 60

Referring to FIG. 4, the PCB installed on the PCBA 50 includes a controller 51, a spindle motor driver (SPM driver) 52, a read/write channel (R/W channel) 53, a voice coil motor (VCM driver) 54, a host interface 55, and a memory 56.

The controller 51 records data on the disk 10 in a data write mode, receives a write command to write the data from a host device 2 and outputs the received data to the R/W channel 53, and reads the data recorded on the disk 10 in a data read mode. The controller 51 converts a signal read by the magnetic head 31 and amplified by a pre-amplifier (Pre-AMP) 61, which is mounted on the bracket 60 as a part of the circuit of the PCBA 50, to a digital signal and outputs the converted signal to the host interface 55. Also, the controller 51 controls the VCM 35 to move the magnetic head 31 to a desired position on the disk 10 and the spindle motor 20 to control a rotational speed of the disk 10. The controller 51 may be a microprocessor or a microcontroller.

The SPM drive 52 controls an amount of a current applied to the spindle motor 20 according to a control signal of the controller 51. The R/W channel 53 in the data write mode receives user input data received through the host interface 55, converts the received data to a binary data stream that is suitable to record, and outputs the converted data to the Pre-AMP 61. In the data read mode, the R/W channel 53 converts a signal read from the disk 10 by the magnetic head 31 and amplified by the Pre-AMP 61 to a digital signal and inputs the converted signal to the controller 51.

The VCM driver 54 controls the amount of current applied to the VCM 35 according to the control signal of the controller 51. The host interface 55 in the data write mode receives commands and data input by the user from a host device 2 and outputs the received command and data to the controller 51 and in the data read mode transmits the data converted to a digital signal to the host device 2. The host device 2 collectively refers to components which generally control and operate a computer system including the hard disk drive, like a CPU or an I/O controller of the computer. The computer system may be a portable electronic apparatus to store and read data and communicate with the hard disk drive and other memory device.

The bracket 60 is assembled at a side (or a portion) of an upper surface of the base 40 and performs a function as a path to electrically connect the parts installed on the upper surface of the base 40 and the PCBA 50 coupled to the lower portion of the base 40. The Pre-AMP 61 is provided at a side (or a portion) of the bracket 60. The Pre-AMP 61 is not installed at the HSA 30 but at the bracket 60 since the hard disk drive 1 according to the present embodiment is a 2.5 inches compact hard disk drive, and a space for the installation of the Pre-AMP 61 is small in the HSA 30. Thus, since the FPC 70 which will be described later is connected to the magnetic head 31 without passing the Pre-AMP 61, an electrostatic discharge (ESD) circuit provided in the Pre-AMP 61 cannot cut a flow of an excess current generated due to the ESD from the FPC 70 to the magnetic head 31. Thus, to solve the problem, in the present embodiment, traces 71-74 of the FPC 70 are arranged different from a conventional FPC.

The Pre-AMP 61 as illustrated in FIG. 4 connects the R/W channel 53 and the VCM driver 54 on the PCB to the FPC 70. Simultaneously, the Pre-AMP 61 amplifies a data signal that the magnetic head 31 reads from the disk 10 or amplifies the write current converted by the R/W channel 53 and outputs the amplified current to the magnetic head 31.

The FPC 70 is used as an electric connection path between the bracket 60 and the HSA 30. As illustrated in FIG. 5, a read trace 71, a write trace 72, a ground (GND) trace 73, and a VCM trace 74 are arranged on the FPC 70 to be parallel to one another in a lengthwise direction of on the FPC 70. In FIG. 5, each of the read and write traces 71 and 72 is provided by one on the FPC 70 for the convenience of explanation. The present general inventive concept is not limited thereto. The read and write traces 71 and 72 are provided on the FPC 70 in a number greater than the number of the magnetic head 31 provided in the hard disk drive 1.

The read trace 71 electrically connects the read head of the magnetic head 31 and the Pre-AMP 61 so that a signal read by the read head from the disk 10 can be input to the Pre-AMP 61. The Pre-AMP 61 pre-amplifies the signal, and the pre-amplified signal is transmitted to the circuit of the PCBA 50 to process the signal and/or a circuit of the host 2 to alternatively process the signal. The write trace 72 electrically connects the write head of the magnetic head 31 and the Pre-AMP 61 so that the write current can be supplied from the Pre-AMP 61 to the write head. The ground trace 73 performs a ground function on the FPC 70. The VCM trace 74 electrically connects the VCM 35 and the VCM driver 54, so that a drive current can be supplied from the VCM driver 54 to a voice coil of the VCM 35.

As described above, before the hard disk drive 1 is completely assembled in a manufacturing process, a user or other conductive bodies can contact the HSA 30 or the FPC 70, and a current due to the ESD may instantly flow in the traces 71-74 of the FPC 70. A relatively high voltage is instantly formed in the read trace 71 electrically connected to the read head by a magnetic field formed by the GND trace 73 and the VCM trace 74. Excess current is supplied to the read head due to the high voltage, so that the read head that is an MR head is damaged and the resistance value can exceed an allowance. Thus, the read head may be arranged as far away from the GND trace 73 or the VCM trace 74 as possible.

In a sequence of the arrangement of the traces 71-74 on the FPC 70 according to the present embodiment, the write trace 72 is arranged between the read trace 71 and the GND and VCM traces 73 and 74. According to the above arrangement sequence of the traces, the read trace 71 is separated from the GND trace 73 and the VCM trace 74 as far as possible. Thus, the read trace 71 is least affected by the magnetic field formed by the GND trace 73 and the VCM trace 74. The possibility of supplying the excess current due to the ESD to the read head connected to the read trace 71 is reduced.

According to the present embodiment, the read trace 71 is spaced apart from one of the GND trace 73 and the VCM trace 74 by a first distance in a direction perpendicular to in a longitudinal direction of the FPC 70, and the write trace 71 is spaced part from the one of the GND trace 73 and the VCM trace 74 by a second distance in the direction. The first distance may be longer than the second distance.

It is possible that the first distance is a multiple of the second distance.

Referring to FIG. 6, according to another embodiment of the present general inventive concept, the magnetic head 31 includes a plurality of magnetic heads. According to the present embodiment, the number of the magnetic heads is two as an example. One of the two magnetic head 31 is referred to as Head0 (H0) and the other one of the two magnetic head 31 is referred to as Head1 (H1). As illustrated in FIG. 6, a write trace 71a and a read trace 72a with respect to the H0, a write trace 74a and a read trace 73a with respect to the H1, a GND trace 75a, and a VCM trace 76a are arranged on an FPC 70a.

The read trace 72a of the head0 H0 is separated from the GND and VCM traces 75a and 76a to lower the possibility that excess current is generated due to the ESD. However, since the read trace 73a of the head1 H1 is arranged relatively closer to the GND and VCM traces 75a and 76a than the read trace of 72a of the head0 H0, the possibility that excess current is generated due to the ESD is relatively high. Thus, as illustrated in FIG. 6, when the write trace 74a of the head1 H1 is arranged close to the GND and VCM traces 75a and 76a, the possibility that excess current is generated due to the ESD in the read trace 73a of the H1 decreases much.

Also, in the present embodiment, as illustrated in FIG. 6, the traces 71a and 72a of the head0 H0 and the traces 73a and 74a of the head1 H1 are symmetrically arranged with respect to a line I-I. That is, the traces 71a-74a of the head0 and head1 H0 and H1 are arranged in order of W0−/W0+/R0−/R0+/R1+/R1−/W1+/W1− in a widthwise direction of the FPC 70a. When the write traces 71a and 74a and the read traces 72a and 73a are provided on the FPC 70a as a multiple of 2, noise between the traces 71a-74a can be reduced by arranging the read and write traces 71a-74a in the same number and symmetrically with respect to the line I-I that is an axis in the lengthwise direction of the FPC 70a. The arrangement of the read and write traces 71a-74a symmetrically with respect to an axis along the lengthwise direction of the FPC 70a is often referred to as "Mirroring Rule". The Mirroring Rule can be applied to a case in which the heads are provided in even numbers such as 4, 6, and 8 in addition to the above two heads (H0 and H1) case according to the present embodiment.

According to the present embodiment, the read trace 71a is spaced apart from one of the GND trace 75a and the VCM trace 76a by a first distance in a direction parallel to the width direction and/or perpendicular to in a longitudinal direction of the FPC 70a, and the write trace 72a is spaced part from the one of the GND trace 75a and the VCM trace 76a by a second distance in the direction. The first distance may be longer than the second distance. The read trace 73a is spaced apart from one of the GND trace 75a and the VCM trace 76a by a third distance in the direction, and the write trace 74a is spaced part from the one of the GND trace 75a and the VCM trace 76a by a fourth distance in the direction. The third distance may be longer than the second distance, and the first and second distances are longer than the third and fourth distances.

It is possible that the first distance is a multiple of the third distance, and the second distance is a multiple of the fourth distance.

In the present embodiment, when the two heads H0 and H1 are provided, a test to check an electrostatic discharge (ESD) characteristic of a hard disk drive according to the arrangement of the traces is performed. In the present test, a field induced charge device model (FI-CDM) is used which forms and charges an electric field in a space where an object for checking the electrostatic characteristic and then discharges the charged static electricity by contacting a conductive body to the object.

First, the FPC 70a having the arrangement almost same as that of the traces 71a, 72a, 73a, 74a, 75a and 76a illustrated in FIG. 6 but having the opposite (reversed) arrangement of the read trace 73a and the write trace 74a of the head1 H1 was selected and connected to the HSA 30. The HSA 30 is charged with static electricity using the FI-CDM and the charged static electricity is discharged by contacting the conductive body to the HSA 30. After the static electricity is discharged, the magnetoresistance values (MRR) of the read head connected to the read trace 72a of the head0 H0 and the read head connected to the read trace 73a of the H1 are measured. The charge, discharge, and MRR measurement are repeated by increasing a voltage to form the electric field of the FI-CDM.

The result of the test is illustrated in FIG. 7. As illustrated in a graph of FIG. 7, there hardly is a change in the MRR of the read head connected to the read trace 72a of the head0 H0. However, the MRR of the read head connected to the read trace 73a of the head1 H1 drastically increases when the voltage of the FI-CDM reaches T1.

Next, after selecting the FPC 70a where the traces are arranged same as that of the traces 71a-76a of FIG. 6, a test is performed in the same manner and the result of the test is illustrated in the graph of FIG. 8. As illustrated in FIG. 8, there hardly is a change in the MRR of the read head connected to the read trace 71a of the head0 H0 as the voltage of the FI-CDM increases. There is also hardly a change in the MRR of the read head connected to the read trace 73a of the head1 H1 as the voltage of the FI-CDM increases. However, the MRR of the read head connected to the read trace 73a of the head1 H1 increases when the voltage of the FI-CDM reaches T2. T2 is greater than T1 by about 450V. The difference between T1 and T2 may vary according to the interval and specifications of the traces 71a-76a, the characteristics of the FPC 70a, and various test conditions.

In the FPC 70a having the arrangement of the traces 71a-76a of FIG. 6, the MRR of the read head connected to the read trace 73a of the head1 H1 is relatively maintained stable. It can be seen that arranging the write trace 75a between the read trace 73a and the GND and VCM traces 75a and 76a as illustrated in FIG. 6 is advantageous for the electrostatic characteristic of the hard disk drive.

According to the embodiments of the present general inventive concept, since an FPC is provided in which at least one write trace is arranged between the read trace and the GND and VCM traces, the damage of the read head by the change in the resistance value due to the ESD can be minimized. That is, the electrostatic characteristic of the hard disk drive can be improved.

Although in the above-described embodiments the GDN trace and the VCM trace are closely arranged on the FPC, the present general inventive concept can be applied to a case in which other traces are arranged between the GDN trace and the VCM trace. In this case, the present general inventive concept can be applied by arranging at least one write trace between the read trace and the GND trace and at least one write trace between the read trace and the VCM trace. The present general inventive concept can be applied to a case in which only one of the GDN trace and the VCM trace exists on the FPC.

According to the above-described embodiments of the present general inventive concept, even when the electrostatic discharge is generated on the flexible printed circuit during the manufacturing process, a hard disk drive in which the change in the magnetoresistance value of the read head can be minimized is provided.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. A hard disk drive apparatus comprising:
 a magnetic head including a write head to record data on a disk and a read head to read the data from the disk;
 at least one actuator arm on which the magnetic head is mounted;

a voice coil motor to rotate the at least one actuator arm across the disk;

a printed circuit board electrically connected to the write head, the read head, and the voice coil motor; and a flexible printed circuit having at least one write trace to electrically connect the write head and the printed circuit board, at least one read trace to electrically connect the read head and the printed circuit board, and a voice coil motor trace to electrically connect the voice coil motor and the printed circuit board, wherein the at least one write trace is arranged between the read trace and the voice coil motor trace with less than two traces between one of the at least one write trace and the voice coil motor trace.

2. The hard disk drive apparatus of claim 1, wherein:

the flexible printed circuit comprises a ground trace further arranged on the flexible printed circuit to ground the flexible printed circuit; and the at least one write trace is arranged between the read trace and the ground trace.

3. The hard disk drive apparatus of claim 2, wherein the voice coil motor trace and the ground trace are arranged close to each other.

4. The hard disk drive apparatus of claim 1, wherein, when each of the write trace and the read trace is provided in a number corresponding to a multiple of two, the write trace and the read trace are arranged in the same number in opposite directions with respect to an axis in a lengthwise direction of the flexible printed circuit, and the write trace and the read trace are arranged symmetrical to the axis in the lengthwise direction of the flexible printed circuit.

5. The hard disk drive apparatus of claim 1, further comprising:

a pre-amplifier provided between the printed circuit board and the flexible printed circuit to amplify a write current supplied to the write head or a read signal read by the read head.

6. The hard disk drive apparatus of claim 5, further comprising:

a base having an upper portion and a lower portion; and a bracket disposed on the upper portion base to electrically connect the upper portion and the lower portion, wherein the pre-amplifier is installed at a portion of the bracket.

7. The hard disk drive apparatus of claim 1, wherein the read head is a magnetoresistive head.

8. The hard disk drive apparatus of claim 1, wherein a radius of the disk is not greater than 2.5 inches.

9. A hard disk drive apparatus comprising:

a magnetic head including a write head to record data on a disk and a read head to read the data recorded on the disk;

at least one actuator arm on which the magnetic head is mounted;

a voice coil motor rotating the at least one actuator arm across the disk;

a printed circuit board electrically connected to the write head, the read head, and the voice coil motor; and a flexible printed circuit having at least one write trace to electrically connect the write head and the printed circuit board, at least one read trace to electrically connect the read head and the printed circuit board, and a ground trace to ground the flexible printed circuit, wherein the at least one write trace is arranged between the read trace and the ground trace with one of the at least one write trace being directly adjacent to the ground trace.

10. The hard disk drive apparatus of claim 9, wherein, when each of the write trace and the read trace is provided in a number corresponding to a multiple of two, the write trace and the read trace are arranged in the same number in the opposite directions with respect to an axis in a lengthwise direction of the flexible printed circuit, and the write trace and the read trace are arranged symmetrical to the axis in the lengthwise direction of the flexible printed circuit.

11. The hard disk drive apparatus of claim 9, further comprising:

a pre-amplifier provided between the printed circuit board and the flexible printed circuit to amplify a write current supplied to the write head or a read signal read by the read head.

12. The hard disk drive apparatus of claim 11, further comprising:

a base having an upper portion and a lower portion; and a bracket disposed on the upper portion base to electrically connect the upper portion and the lower portion, wherein the pre-amplifier is installed at a portion of the bracket.

13. The hard disk drive apparatus of claim 9, wherein the read head is a magnetoresistive head.

14. The hard disk drive apparatus of claim 9, wherein the radius of the disk is not greater than 2.5 inches.

15. A hard disk drive apparatus comprising:

a magnetic head including a write head to record data on a disk and a read head to read the data recorded on the disk;

at least one actuator arm on which the magnetic head is mounted;

a voice coil motor rotating the at least one actuator arm across the disk;

a printed circuit board electrically connected to the write head, the read head, and the voice coil motor; and a flexible printed circuit having at least one write trace to electrically connect the write head and the printed circuit board, at least one read trace to electrically connect the read head and the printed circuit board, a ground trace to ground the flexible printed circuit, and a voice coil motor trace to electrically connect the voice coil motor and the printed circuit board, wherein the at least one write trace is arranged between the read trace and one of the voice coil motor trace and the ground trace with no trace between one of the at least one write trace and the one of the voice coil motor trace and the ground trace.

16. A hard disk drive apparatus comprising:

a magnetic head including a write head to record data on a disk and a read head to read the data recorded on the disk;

at least one actuator arm on which the magnetic head is mounted;

a voice coil motor rotating the at least one actuator arm across the disk;

a printed circuit board electrically connected to the write head, the read head, and the voice coil motor; and a flexible printed circuit having at least one write trace to electrically connect the write head and the printed circuit board, at least one read trace to electrically connect the read head and the printed circuit board, and at least one of a ground trace to ground the flexible printed circuit and a voice coil motor trace to electrically connect the voice coil motor and the printed circuit board and disposed such that the at least one write trace is arranged between the read trace and the one of the voice coil motor trace and the ground trace and directly adjacent to the one of the voice coil motor trace and the ground trace.

17. The hard disk drive apparatus of claim 16, wherein the at least one write trace, the at least one read trace, the ground trace, and the voice coil motor trace are arranged in order.

18. The hard disk drive apparatus of claim 16, wherein the at least one read trace is spaced-apart from the one of the voice coil motor trace and the ground trace by a first distance, and the least one write trace is spaced-apart from the one of the voice coil motor trace and the ground trace by a second distance shorter than the first distance.

19. The hard disk drive apparatus of claim 16, wherein the printed circuit board comprises a pre-amplifier, and the flexible printed circuit is disposed between the pre-amplifier and at least one of the magnetic head and the voice coil motor.

20. The hard disk drive apparatus of claim 16, further comprising:
a base;
a bracket formed on the base; and
a pre-amplifier disposed on the bracket and connected to the flexible printed circuit to amply data.

21. The hard disk drive apparatus of claim 16, further comprising:
a base;
a bracket formed on the base; and
a pre-amplifier disposed on the bracket,
wherein the flexible printed circuit comprises a first end connected to the magnetic head and the voice coil motor and a second end connected to the pre-amplifier.

22. The hard disk drive apparatus of claim 16, wherein:
the at least one write trace comprises first and second write traces;
the at least one read trace comprises first and second read traces; and
the first write trace is disposed between the first and second read traces.

23. The hard disk drive apparatus of claim 16, wherein:
the at least one write trace comprises first and second write traces;
the at least one read trace comprises first and second read traces; and
the second read trace is disposed between the first and second write traces.

24. The hard disk drive apparatus of claim 16, wherein:
the at least one write trace comprises first and second write traces;
the at least one read trace comprises first and second read traces; and
at least one of the first and second write traces is spaced-apart from the one of the voice coil motor trace and the ground trace by a first distance, at least one of the first and second read traces is spaced-apart from the one of the voice coil motor trace and the ground trace by a second distance, and the first distance is longer than the second distance.

25. A flexible printed circuit included in a hard disk drive apparatus, the flexible printed circuit comprising:
one or more first heads, each of the one or more first heads including a first read trace and a first write trace;
a ground trace located directly adjacent to the first write trace of one of the one or more first heads; and
a voice coil motor trace located adjacent to the ground trace,
wherein the ground trace is located between the first read trace of the one or more first heads and the voice coil motor trace.

26. The flexible printed circuit of claim 25, further comprising:
one or more second heads, each of the one or more second heads including a second read trace and a second write trace,
wherein the first read trace of the one or more first heads are located between the second read trace of the one or more second heads and the ground trace.

27. The flexible printed circuit of claim 26, wherein the first read trace of the one or more first heads are arranged in a mirror image to the second read trace of the one or more second heads.

28. The flexible printed circuit of claim 25, wherein the flexile printed circuit includes traces for only read, write, ground, and voice coil motor.

* * * * *